United States Patent
Kimura et al.

(10) Patent No.: US 6,690,246 B2
(45) Date of Patent: Feb. 10, 2004

(54) OSCILLATOR AND PRODUCTION METHOD THEREFOR

(75) Inventors: Masahiko Kimura, Kusatsu (JP);
Akira Ando, Omihachiman (JP);
Takuya Sawada, Lausanne (CH);
Koichi Hayashi, Omihachiman (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 64 days.

(21) Appl. No.: 10/189,125

(22) Filed: Jul. 3, 2002

(65) Prior Publication Data

US 2003/0095010 A1 May 22, 2003

(30) Foreign Application Priority Data

Jul. 10, 2001 (JP) ........................................ 2001-209270

(51) Int. Cl.[7] ................................................. H03B 5/32
(52) U.S. Cl. ........................................ 331/176; 331/158
(58) Field of Search ........................ 331/116 R, 116 FE, 331/158, 176

(56) References Cited

FOREIGN PATENT DOCUMENTS

JP 52-118598 * 10/1977
JP 2000-281434 * 10/2000

* cited by examiner

*Primary Examiner*—David C. Mis

(74) *Attorney, Agent, or Firm*—Dickstein, Shapiro, Morin & Oshinsky, LLP.

(57) ABSTRACT

A feedback circuit and amplifiers using a vibrator comprising a piezoelectric body having a bismuth layered compound as the main ingredient thereof are provided so as to generate oscillation. Load capacitors comprising the feedback circuit together with the vibrator are formed. These load capacitors each have, as the main ingredient thereof, a dielectric body which decreases in the relative dielectric constant with the increase in temperature in the region not less than one half the temperature range from −20 to 80° C., and in which the $\epsilon$-TC is not less than 5000 ppm/° C., wherein the $\epsilon$-TC is an average change rate of the relative dielectric constant in the above-described temperature range and is represented by $(C_{max}-C_{min})/(C_{20} \cdot 100)$, where $C_{max}$ is the maximum value of capacitance in the above-described temperature range, $C_{min}$ is the minimum value of capacitance in the above-described temperature range, and $C_{20}$ is the capacitance at 20° C.

4 Claims, 3 Drawing Sheets

OSCILLATOR AND PRODUCTION METHOD THEREFOR

BACKGROUND OF THE INVENTION

1. Field of the Invention

The present invention relates to an oscillator having a feedback circuit and amplifiers using a piezoelectric vibrator, and to a production method therefor.

2. Description of the Related Art

In oscillators comprising a feedback circuit and amplifiers using a piezoelectric vibrator, piezoelectric ceramic compositions having lead titanate zirconate ($Pb(Ti_xZr1-x)O_3$) or lead titanate ($PbTiO_3$) as the main ingredients thereof, are in widespread use as piezoelectric vibrators.

However, since piezoelectric ceramic compositions having lead titanate zirconate or lead titanate as the main ingredients thereof contain a large amount of lead therein, a problem has arisen in that the uniformity of products decreases because of the evaporation of lead oxides in the production process.

To prevent this problem from occurring, it is desirable to use a piezoelectric ceramic composition that does not contain therein any lead at all, or that contains therein only a little lead. Also, from the viewpoint of the environmental pollution problem, the less the content of lead, the further environmental friendliness is improved.

Accordingly, as a substitute for a piezoelectric ceramic composition having lead titanate or the like as the main ingredient thereof, it has been thought of using a bismuth layered compound such as $SrBi_2Nb_2O_9$ or $CaBi_4Ti_4O_{15}$. Since the piezoelectric ceramic composition having a bismuth layered compound as the main ingredient thereof contains therein no lead oxides, there is no risk that it raises the above-described problem.

In general, the oscillation frequency of an oscillator comprising a feedback circuit and amplifiers using a piezoelectric vibrator changes with the change in temperature. One of the major factors of this frequency change, the change in the resonant frequency of the piezoelectric body with temperature.

It is generally desirable, therefore, to use a piezoelectric body having a minimum of temperature-change of resonant frequency. However, in a piezoelectric ceramic composition having, as the main ingredient thereof, a bismuth layered compound such as $SrBi_2Nb_2O_9$ or $CaBi_4Ti_4O_{15}$, the temperature change fr-TC of the resonant frequency at $-20$ to $80°$ C., which is the working temperature range for common oscillators, is high. Accordingly, such a piezoelectric ceramic composition is difficult to use as a piezoelectric vibrator for an oscillator requiring a high oscillation frequency accuracy.

$$fr\text{-}TC=(fr(\max)-fr(\min))/(fr(20)\cdot 100)$$

Here, fr(max) is the maximum resonant frequency in the temperature range from $-20$ to $80°$ C., fr(min) is the minimum resonant frequency in the temperature range from $-20$ to $80°$ C., and fr(20) is the frequency at $20°$ C.

In an oscillator or the like using a quartz vibrator, an attempt has been made to cancel the temperature-change of the resonant frequency of the quartz vibrator with the temperature-changes of load capacitors.

This attempt is to provide an oscillation circuit with a temperature compensated circuit comprising capacitors and a thermistor, and to thereby cause this temperature compensated circuit to perform the function as a load capacitor that cancels the temperature-change of the resonant frequency of the quartz vibrator. This oscillation circuit is generally referred to as a temperature compensated crystal oscillator (TCXO).

Although it is possible to apply this method to an oscillator using an vibrator comprising a piezoelectric body having a bismuth layered compound as the main ingredient thereof, a problem occurs in that this results in an increase in the production cost and upsizing of the oscillator because of an increase in the number of components. If the temperature-change of the resonant frequency of a bismuth layered compound can be cancelled by utilizing only the temperature-change of the relative dielectric constant of a dielectric used as a load capacitor, it will become possible to easily improve the temperature change rate of resonant frequency.

It has been reported that some of bismuth layered compounds decrease in the resonant frequencies with the increase in temperature in the temperature range from $-20$ to $80°$ C. (see, for example, Jpn. J. Appl. Phy., Vol. 38, Part 1, 9B, pp. 5557–5560). Since it is well known that the resonant frequency of an oscillator increases with the decrease in load capacitance, it can be expected that the temperature-change of the resonant frequency of a piezoelectric oscillator using such a bismuth layered compound can be cancelled by using, as load capacitors, dielectric bodies that decrease in the relative dielectric constant with the increase in temperature at the temperature range from $-20$ to $80°$ C. However, no concrete examination has been made as far as the inventors of the present application know.

SUMMARY OF THE INVENTION

To solve the above-described problems, the present invention provides an oscillator having a feedback circuit and amplifiers using a vibrator that comprises a piezoelectric body having a bismuth layered compound as the main ingredient thereof. This oscillator comprises load capacitors comprising a feedback circuit together with the vibrator. The load capacitors each have as the main ingredient thereof, a dielectric body which decreases in a relative dielectric constant with an increase in temperature in a region not less than one half a temperature range from $-20$ to $80°$ C., and in which the $\epsilon$-TC is not less than 5000 ppm/$°$ C., wherein the $\epsilon$-TC is an average change rate of the relative dielectric constant in the temperature range from $-20$ to $80°$ C. and is represented by $(C\max-C\min)/(C_{20}\cdot 100)$, where Cmax is the maximum value of capacitance in the temperature range from $-20$ to $80°$ C., Cmin is the minimum value of capacitance in the temperature range from $-20$ to $80°$ C., and $C_{20}$ is the capacitance at $20°$ C.

According to these arrangements, by setting the $\epsilon$-TC of each of the load capacitors to be not less than 5000 ppm/$°$ C., it is possible to improve the temperature stability of oscillation frequency by the feedback circuit and amplifiers using the vibrator comprising the piezoelectric body having a bismuth layered compound as the main ingredient thereof.

The present invention also provides a method for producing an oscillator having a feedback circuit and amplifiers using a vibrator that comprises a piezoelectric body having a bismuth layered compound as the main ingredient thereof. This method comprises the step of using load capacitors which comprise a feedback circuit together with a vibrator. The load capacitors each have, as the main ingredient thereof, a dielectric body which decreases in the relative dielectric constant with the increase in temperature in the region not less than one half the temperature range from $-20$ to $80°$ C., and in which the $\epsilon$-TC is not less than 5000 ppm/$°$ C., wherein the $\epsilon$-TC is an average change rate of the relative dielectric constant in the temperature range from $-20$ to $80°$ C. and is represented by $(C\max-C\min)/(C_{20}\cdot 100)$, where Cmax is the maximum value of capacitance in the temperature range from $-20$ to $80°$ C., Cmin is the minimum value of capacitance in the temperature range from $-20$ to $80°$ C., and $C_{20}$ is the capacitance at $20°$ C.

According to this method, by using the load capacitors each having, as the main ingredient thereof, a dielectric body of which the $\epsilon$-TC is not less than 5000 ppm/° C., it is possible to improve the temperature stability of oscillation frequency by the feedback circuit and amplifiers using the vibrator comprising the piezoelectric body having a bismuth layered compound as the main ingredient thereof.

In the above arrangements and method, the reason why the $\epsilon$-TC, which is an average change rate of the relative dielectric constant in the temperature range from −20 to 80° C., is set to be not less than 5000 ppm/° C. is because, if it were not, a sufficient effect on the improvement in the temperature-change of the oscillation frequency would not be achieved.

Preferably, a bismuth compound used as a vibrator is at least one compound selected from the group consisting of $Bi_2WO_6$, $CaBi_2Nb_2O_9$, $SrBi_2Nb_2O_9$, $BaBi_2Nb_2O_9$, $PbBi_2Nb_2O_9$, $CaBi_2Ta_2O_9$, $SrBi_2Ta_2O_9$, $BaBi_2Ta_2O_9$, $PbBi_2Ta_2O_9$, $Bi_3TiNbO_9$, $Bi_3TiTaO_9$, $Bi_4Ti_3O_{12}$, $SrBi_3Ti_2NbO_{12}$, $BaBi_3Ti_2NbO_{12}$, $PbBi_3Ti_2NbO_{12}$, $CaBi_4Ti_4O_{15}$, $SrBi_4Ti_4O_{15}$, $BaBi_4Ti_4O_{15}$, $PbBi_4Ti_{401}$, $Na_{05}Bi_{45}Ti_4O_{15}$, $K_{05}Bi_{45}Ti_4O_{15}$, $Ca_2Bi_4Ti_5O_{18}$, $Sr_2Bi_4Ti_5O_{18}$, $Ba_2Bi_4Ti_5O_{18}$, $Pb_2Bi_4Ti_5O_{18}$, $Bi_6Ti_3WO_{18}$, $Bi_7Ti_4NbO_{21}$, and $Bi_{10}Ti_3W_3O_{30}$.

It is preferable that the above-described load capacitors each comprise a dielectric ceramic composition having, as the main ingredient thereof, a ceramic composition with a Perovskite type crystal structure.

Also, preferably, the load capacitors each comprise a dielectric ceramic composition having, as the main ingredient thereof, a ceramic composition having a composition formula of $(Ba_{1-x}Sr_x)TiO_3$ where x=0.4 to 0.7. The reason why it is preferable that the value of x in the above-described composition formula be in the range from 0.4 to 0.7 is because, outside this range, a sufficient effect of the present invention would not be achieved.

The above and other objects, features, and advantages of the present invention will be clear from the following detailed description of the preferred embodiments of the invention in conjunction with the accompanying drawings.

DESCRIPTION OF THE PREFERRED EMBODIMENTS

Figure 1:
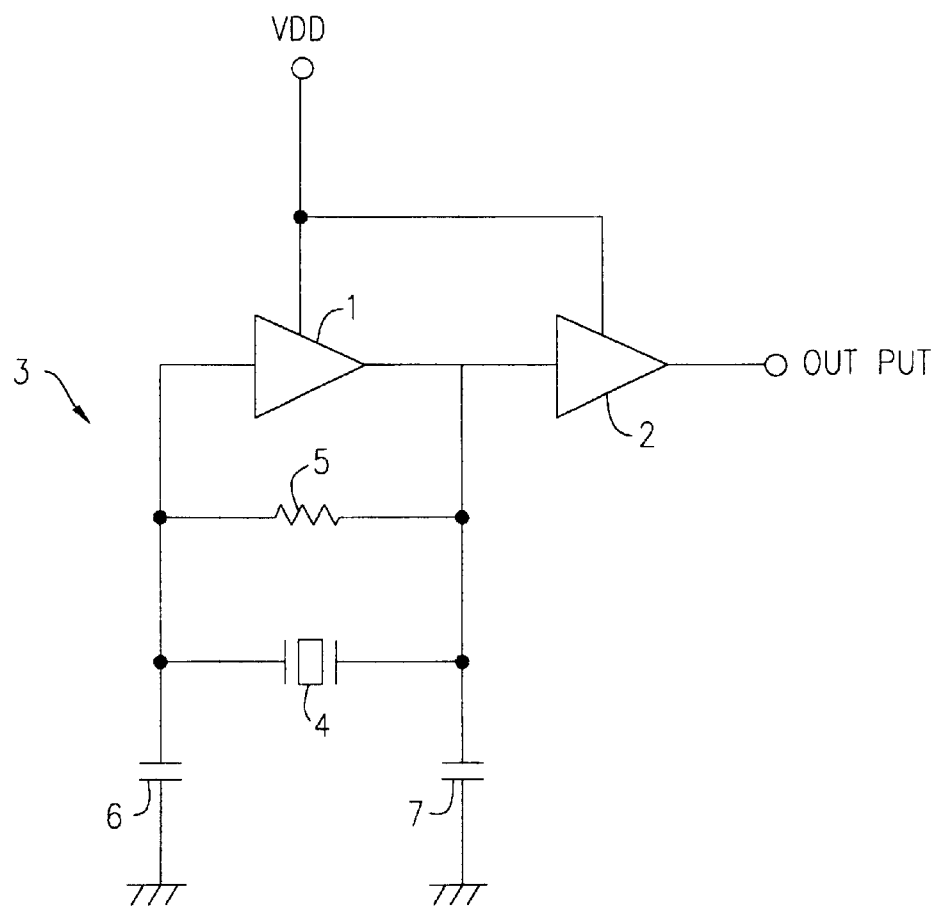
FIG. 1 is a circuit diagram of an oscillator according to the present invention.

Referring to FIG. 1, the oscillator according to an embodiment of the present invention has two inverters (amplifiers): a first inverter 1 and a second inverter 2, which are interconnected in series. The first and second inverters 1 and 2 are each supplied with a source voltage ($V_{DD}$). A feedback circuit 3 for feeding back an output of the first inverter 1 to the input side thereof is provided so as to oscillate the output of the first inverter 1.

The feedback circuit 3 comprises a vibrator 4 connected to both the input and output sides of the first inverter 1, a resistor 5 connected to the vibrator 4 in parallel, a first load capacitor 6 connected to the input side of the first inverter 1, and a second load capacitor 7 connected to the output side of the first inverter 1. The other terminal of each of the first and second load capacitors 6 and 7 is grounded. Such an oscillator is designated as a "Colpitts oscillation circuit".

The vibrator 4 comprises a piezoelectric body having a bismuth layered compound as the main ingredient thereof. The first and second load capacitors 6 and 7 each having, as the main ingredient thereof, a dielectric body which decreases in the relative dielectric constant with the increase in temperature in the region not less than one half the temperature range from −20 to 80° C., and in which the $\epsilon$-TC is not less than 5000 ppm/° C., wherein the $\epsilon$-TC is an average change rate of the relative dielectric constant in the temperature range from −20 to 80° C. and is represented by $(Cmax-Cmin)/(C_{20} \cdot 100)$, where Cmax is the maximum value of capacitance in the temperature range from −20 to 80° C., Cmin is the minimum value of capacitance in the temperature range from −20 to 80° C., $C_{20}$ is the capacitance at 20° C., and 100 is a numeric value based on (80° C. to (−20° C.)).

In this manner, in the vibrator 4 containing no lead, and comprising a piezoelectric body having a bismuth layered compound as the main ingredient thereof, setting the $\epsilon$-TC of each of the first and second load capacitors 6 and 7 to be not less than 5000 ppm/° C., makes it possible to improve the temperature change rate of oscillation frequency. Accordingly, a more reliable oscillator that has been improved in the temperature stability of oscillation frequency is achieved.

Hereinafter, descriptions will be made of oscillators each of which uses, as the vibrator 4 comprising a piezoelectric body, a secondary harmonic vibrator having a thickness extensional vibration mode that comprises a piezoelectric ceramic composition having $SrBi_2Nb_2O_9$ and $CaBi_4T_4iO_{15}$ as the main ingredients thereof and that has a structure shown in FIG. 2. Each oscillator uses different load capacitors comprising barium titanate-based dielectric ceramic compositions.

The production method for the vibrator 4 is as follows. First, as starting substances, $SrCO_3$, $Bi_2O_3$, $CaCO_3$, $Nb_2O_5$, $TiO_2$, and $MnCO_3$ were prepared. These substances were each weighed so as to become chemical formulas: $SrBi_2Nb_2O_9$+1 mol % $MnCO_3$ (hereinafter abbreviated as SBN), and $CaBi_4Ti_4O_{15}$+1 mol % $MnCO_3$ (hereinafter abbreviated as CBT), and by performing wet mixing with respect to each of them using a bowl mill for about 16 hours, respective mixtures were achieved. After being dried, the obtained mixtures were each calcined at 700 to 900° C., and thereby respective calcined materials were obtained.

Then, after being coarsely pulverized; each of the calcined materials, with a proper amount of organic binder added, was subjected to wet pulverization using the ball mill for 16 hours, and thereafter undergone sheet molding by the doctor blade method. Out of the samples sheet-molded into a thickness of 40 to 80 µm, one portion thereof had its electrodes printed with a paste. Sheets of which the electrodes were formed by the printing and sheets without electrodes were alternately overlaid on one another in the thickness direction, and were press-bonded. Thereby, an energy-confined type ceramic element 8 shown in FIG. 2 was produced.

Figure 2:
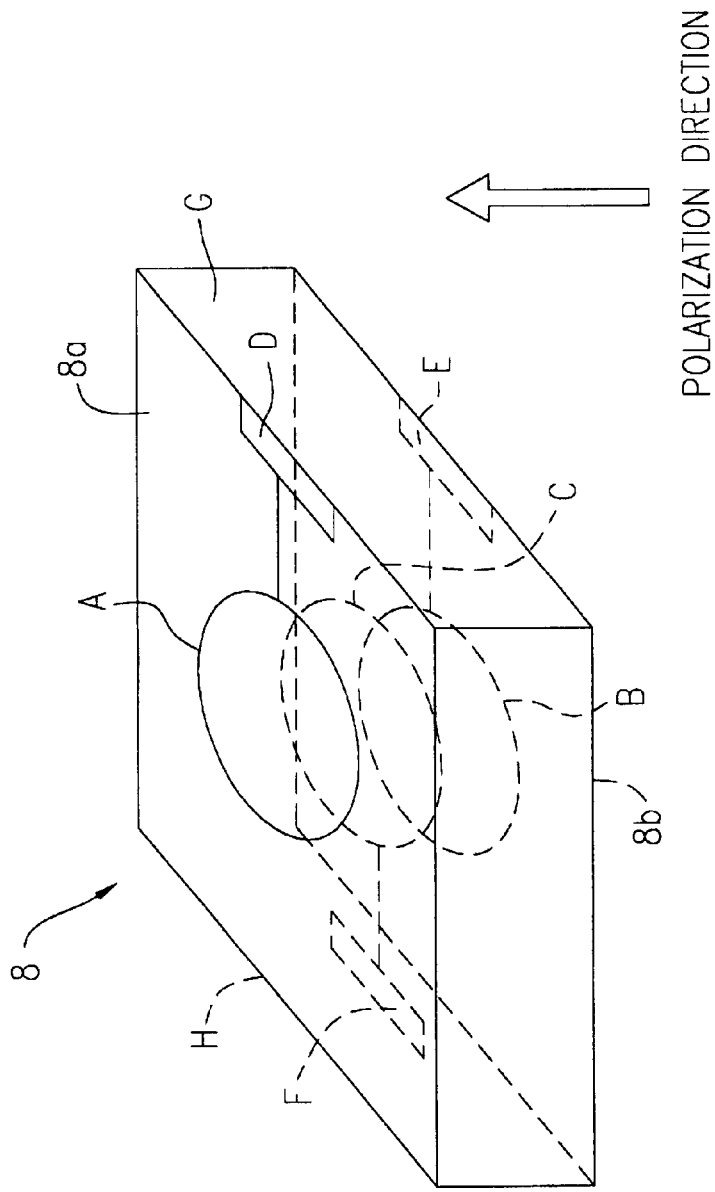
FIG. 2 is a perspective view of a vibrator used in the oscillator according to the present invention.

Referring to FIG. 2, the ceramic element 8 is a rectangular parallelepiped, and has a circular electrode A and a circular electrode B on the top surface 8a and the bottom surface 8b (the two end faces in the thickness direction) of the ceramic element 8, respectively. The circular electrodes A and B are located at the centers of the top and bottom surfaces 8a and 8b of the ceramic element 8, respectively, and the ceramic element 8 is set so that the circular electrode B is located directly underneath the circular electrode A when the ceramic element 8 is vertically viewed from the top surface side thereof.

Inside the ceramic element 8, a circular electrode C is located midway between the circular electrodes A and B, and the circular electrodes A, B and C coincide with one another when the ceramic element 8 is vertically viewed from the top surface side thereof. Lead-out electrodes D, E and F, respectively, are formed so as to extend from the circular electrodes A, B and C to end faces of the ceramic element 8.

Specifically, the lead-out electrodes D and E are each formed exposed to an end face G of the ceramic element 8, and the lead-out electrode F is formed exposed to an end face H (the opposite face to the end face G) of the ceramic element 8. With voltages applied from these lead-out electrodes D, E and F on these end surfaces, a potential difference occurs between the external circular electrodes A and B and the internal circular electrode C, and thereby the ceramic element 8 can be excited in the secondary harmonic mode with a thickness extensional vibration.

Such a ceramic element 8 was baked at 1100 to 1300° C., and was subjected to a polarizing process by applying a DC voltage of 5 to 10 kV/mm in an insulating oil at 100 to 200° C. for 10 to 30 min, and thereby a piezoelectric ceramic as the vibrator 4 was obtained. As indicated in FIG. 2, the polarization direction is the direction perpendicular to the electrode surfaces of the circular electrodes A, B and C, that is, in the thickness direction of the ceramic element 8.

With respect to the obtained piezoelectric ceramic samples, the temperature-changes of the resonant frequencies in the secondary harmonic mode in the thickness extensional vibration in the temperature range from −20 to 80° C. were measured. The results were that both SBN and CBT decreased in the resonant frequency with the increase in temperature, and that the temperature change rate of resonant frequency, fr-TC was 20.7 ppm/° C. for SBN and 29.6 ppm/° C. for CBT.

Next, as the first and second load capacitors 6 and 7, dielectric ceramic compositions having, as the main ingredient thereof, a ceramic composition expressed by $(Ba_{1-x}Sr_x)TiO_3$ (here, x=0.3 to 0.8) were used for embodiments of the present invention. The production method therefor will be shown below.

First, as starting substances, $BaCO_3$, $SrCO_3$, $TiO_2$, and $MnCO_3$ were prepared. These substances were each weighed so as to become chemical formulas: $(Ba_{1-x}Sr_x)TiO_3+0.3$ wt % $Al_2O_3+0.3$ wt % $SiO_2$ (here, x=0.3 to 0.8), and by performing wet mixing with respect thereto using a bowl mill for about 16 hours, a mixture was achieved. After being dried, the obtained mixture was calcined at 900 to 1200° C., and thereby a calcined material was obtained.

Then, after being coarsely pulverized, the calcined material, with a proper amount of organic binder added, was subjected to wet pulverization using the ball mill for 16 hours, and after being dried, undergone a particle size adjustment through a 40 mesh sieve.

Next, a disk having a diameter of 12 mm and a thickness of 1.2 mm was molded of the above-described pulverized calcined material under a pressure of 1000 kg/cm², and then the disk was baked at 1250 to 1350° C. using an ordinary baking method to obtain a disk-like ceramic sample.

Using an ordinary method, a silver paste was applied and printed on both the main surfaces of this ceramic sample, and thereby silver electrodes were formed thereon. Then, the ceramic sample was cut so that the capacitance between the electrodes on the two main surfaces becomes 20 pF, and thereby a load capacitance element was obtained.

Hereinafter, the discrimination among the load capacitance elements is performed by the x-values (0.3 to 0.8) of used compositions. Also, ordinary capacitors with a capacitance of 20 pF, each having $TiO_2$, of which the relative dielectric constant at −20 to 80° C. is small, as the main ingredient thereof, were prepared. These were used as load capacitance elements for comparison, i.e., as monitors.

Figure 3:
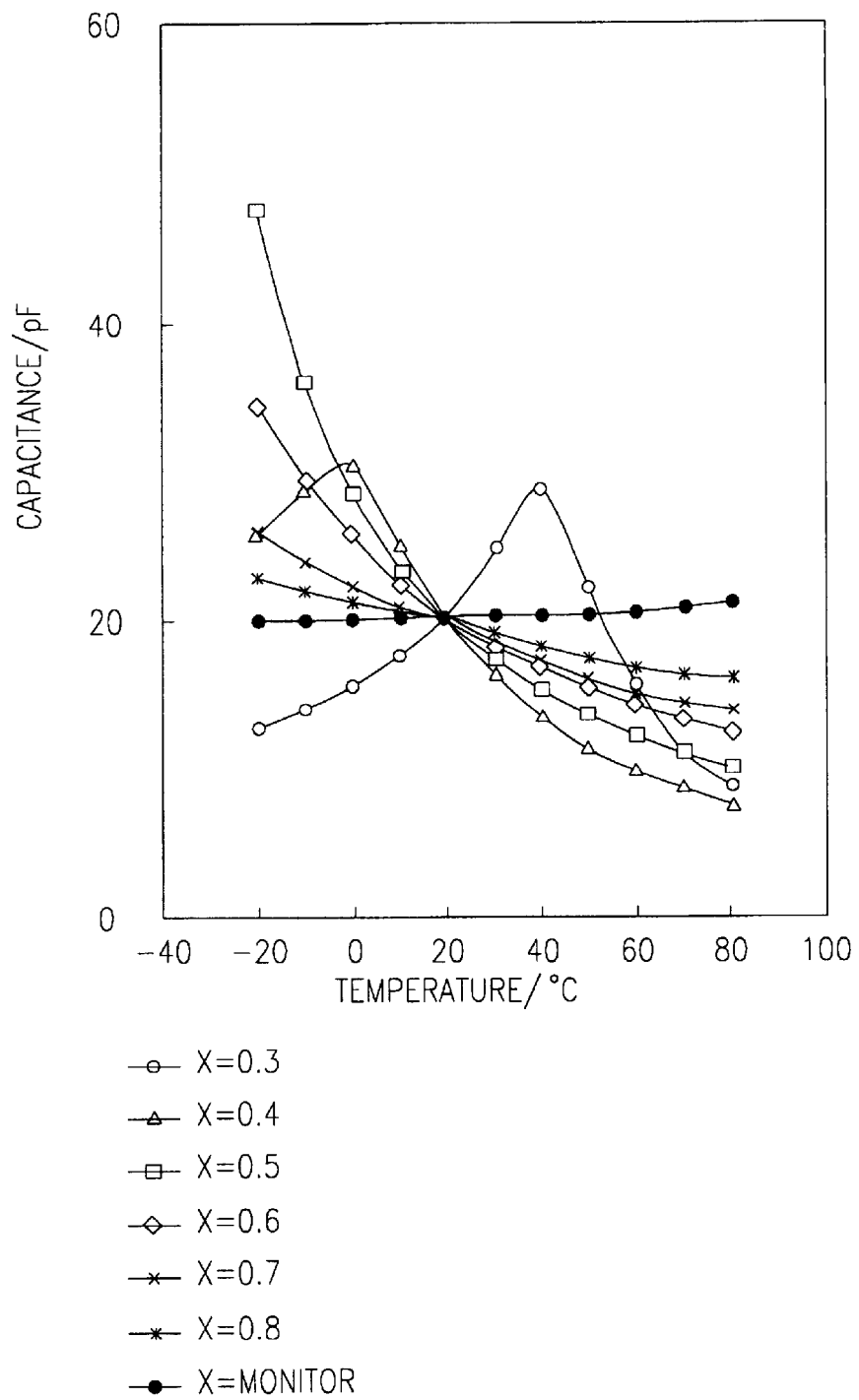
FIG. 3 is a diagram showing the temperature-dependency of the capacitance of the load capacitance elements used in the oscillator according to the present invention.

FIG. 3 shows the temperature-dependencies of the capacitances of these load capacitance elements. Table 1 shows the temperature change rates ±-TC of relative dielectric constant in the temperature range from −20 to 80° C.

TABLE 1

| x | 0.3 | 0.4 | 0.5 | 0.6 | 0.7 | 0.8 | MONITOR |
|---|---|---|---|---|---|---|---|
| ε-TC | 10130 | 11512 | 18832 | 10944 | 5887 | 3504 | 479 |

It can be seen from FIG. 3 and Table 1, that compositions in which the relative dielectric constants decrease with the increase in temperature in the region not less than one half the temperature range from −20 to 80° C., total to five compositions as follows: x=0.4, x=0.5, x=0.6, x=0.7, and x=0.8. Among these, the compositions of which the ε-TC are not less than 5000 ppm/° C., are x=0.4, x=0.5, x=0.6, and x=0.7 and therefore, these four examples correspond to the embodiments in the scope of the present invention.

Next, a Colpitts type oscillation circuit shown in FIG. 1 was formed by using the above-described piezoelectric vibrator, load capacitors and the like, and the relationship between the kind of load capacitor and the temperature change rate of resonant frequency, fosc-TC (unit: ppm/° C.) was investigated.

$$fosc\text{-}TC=(fosc(\max)-fosc(\min))/(fosc(20)\cdot 100)$$

Here, fosc(max) is the maximum oscillation frequency in the temperature range from −20 to 80° C., fosc(min) is the minimum oscillation frequency in the temperature from −20 to 80° C., and fosc(20) is the frequency at 20° C. The investigated results of fosc-TC are shown in Table 2 below.

TABLE 2

| No. | COMPOSITION OF VIBRATOR | COMPOSITION OF CAPACITANCE | fosc-TC |
|---|---|---|---|
| 1* | SBN | x = 0.3 | 16.6 |
| 2 | SBN | x = 0.4 | 9.6 |
| 3 | SBN | x = 0.5 | 7.2 |
| 4 | SBN | x = 0.6 | 11.9 |
| 5 | SBN | x- = 0.7 | 14.3 |
| 6* | SBN | x = 0.8 | 17.6 |
| 7* | SBN | MONITOR | 18.1 |
| 8* | CBT | x = 0.3 | 19.8 |
| 9 | CBT | x = 0.4 | 13.7 |
| 10 | CBT | x = 0.5 | 11.3 |
| 11 | CBT | x = 0.6 | 14.0 |
| 12 | CBT | x- = 0.7 | 15.0 |
| 13* | CBT | x = 0.8 | 22.2 |
| 14* | CBT | MONITOR | 25.9 |

As shown in Table 2, any of the samples according to the embodiments of the present invention has an fosc-TC (ppm/° C.) that is not more than 15, that is, any of them is small in the temperature-change of relative dielectric constant as compared to the cases (monitors, or comparative examples) where ordinary capacitors having, as the main ingredient thereof, $TiO_2$ with a small temperature-change of relative dielectric constant, are used. It is thus evident that the samples according to the present embodiments are useful for piezoelectric oscillators. In Table 1, the samples marked with "*" are ones falling outside the scope of the present invention.

The reason why the temperature change rate of oscillation frequency, fosc-TC, decreases in this manner would be because the decrease in resonant frequency of the piezoelectric vibrator due to temperature change and the increase in oscillation frequency due to the decrease in load capacitance cancel each other out.

Meanwhile, the vibrator comprising a piezoelectric body and the load capacitors according to the present invention are not limited to the materials and forms of the above-described embodiments. However, the vibrator and load capacitors are effective as long as they fall within the scope of the subject matter of the invention. Also, with regard to the vibration mode of the above-described vibrator, a thickness extensional vibration secondary harmonic mode has been used in the embodiments. However, other mode such as a thickness extensional vibration tertiary harmonic mode or a thickness shear vibration mode also may be employed. Furthermore, as the oscillation circuit, the Colpitts circuit shown in FIG. 1 has been adopted, but the oscillation circuit is not restricted to the Colpitts circuit as long as it falls within the scope of the subject matter of the invention.

The oscillation frequency fosc of the Colpitts circuit is expressed by the following equation.

$$fosc = fr \cdot (1 + C1/(C0 + CL))^{1/2} \quad (1)$$

Here, the capacitances of the load capacitors 6 and 7 are CL1 and CL2, respectively, the resonant frequency of the vibrator 4 is fr, the equivalent serial capacitance of the vibrator 4 is C1, and the equivalent parallel capacitance of the vibrator 4 is C0, where $CL = (CL1 \cdot CL2)/(CL1 + CL2)$.

When a bismuth compound is used as the vibrator 4, fr decreases with the increase in temperature and therefore, it is understood that CL should be also reduced with the increase in temperature. In order to reduce CL with the increase in temperature, it is necessary to reduce CL1 and CL2 with the increase in temperature, as well.

It can be understood, therefore, that use of load capacitors having a capacitance-temperature characteristic with a negative slope, as CL1 and CL2, would allow the temperature characteristic of fr with a negative slope to be cancelled out.

In general, the bismuth compound has an electromechanical coupling coefficient k smaller than those of the existing piezoelectric ceramics (in the present embodiments, k=10 to 20%). Also, the electromechanical coupling coefficient k is proportional to C1/C0. Therefore, when k is small, C1/C0 is also small, and hence, as can be seen from the expression (1), the effect of cancellation by the change in CL decreases. As can be seen from the foregoing, in an oscillator using the vibrator 4 comprising a bismuth compound with a small electromechanical coupling coefficient k, it is recommended that first and second load capacitors 6 and 7 having a capacitance-temperature characteristic with a negative slope and a large temperature change rate of relative dielectric constant be used.

According to the present invention, in the oscillator 4 comprising the feedback circuit and amplifiers using the vibrator having a bismuth layered compound as the main ingredient thereof, since the $\epsilon$-TC of each of the load capacitors in the feedback circuit is not less than 5000 ppm/° C., the temperature change rate of oscillation frequency, fosc-TC can be made small, thereby providing the effect of achieving a useful oscillator that has a high oscillation frequency accuracy at a low production cost and without the need to significantly change the size of elements.

While the present invention has been described with reference to what are at present considered to be the preferred embodiments, it is to be understood that various changes and modifications may be made thereto without departing from the invention in its broader aspects and therefore, it is intended that the appended claims cover all such changes and modifications that fall within the true spirit and scope of the invention.

What is claimed is:

1. An oscillator having a feedback circuit and amplifiers using a vibrator comprising a piezoelectric body having a bismuth layered compound as the main ingredient thereof, said oscillator comprising:

load capacitors comprising the feedback circuit together with the vibrator, said load capacitors each having, as the main ingredient thereof, a dielectric body in which a relative dielectric constant decreases with an increase in temperature in a region not less than one half a temperature range from −20 to 80° C., and in which an $\epsilon$-TC is not less than 5000 ppm/° C., wherein the $\epsilon$-TC is an average change rate of the relative dielectric constant in the temperature range from −20 to 80° C. and is represented by $(Cmax-Cmin)/(C_{20} \cdot 100)$, where Cmax is the maximum value of capacitance in the temperature range from −20 to 80° C., Cmin is the minimum value of capacitance in the temperature range from −20 to 80° C., and $C_{20}$ is the capacitance at 20° C.

2. The oscillator according to claim 1, wherein said load capacitors each comprise a dielectric ceramic composition having, as the main ingredient thereof, a ceramic composition with a Perovskite type crystal structure.

3. The oscillator according to claim 1, wherein said load capacitors each comprise a dielectric ceramic composition having, as the main ingredient thereof, a ceramic composition having a composition formula of $(Ba_{1-x}Sr_x)TiO_3$, where x=0.4 to 0.7.

4. A method for producing an oscillator having a feedback circuit and amplifiers using a vibrator that comprises a piezoelectric body having a bismuth layered compound as the main ingredient thereof, said method comprising:

using, as load capacitors comprising the feedback circuit together with the vibrator, load capacitors each having, as the main ingredient thereof, a dielectric body which decreases in a relative dielectric constant with an increase in temperature in a region not less than one half a temperature range from −20 to 80° C., and in which an $\epsilon$-TC is not less than 5000 ppm/° C., wherein the $\epsilon$-TC is an average change rate of the relative dielectric constant in the temperature range from −20 to 80° C. and is represented by $(Cmax-Cmin)/(C_{20} \cdot 100)$, where Cmax is the maximum value of capacitance in the temperature range from −20 to 80° C., Cmin is the minimum value of capacitance in the temperature range from −20 to 80° C., and $C_{20}$ is the capacitance at 20° C.

* * * * *